US007863892B2

(12) United States Patent
Morley et al.

(10) Patent No.: US 7,863,892 B2
(45) Date of Patent: Jan. 4, 2011

(54) MULTIPLE SQUID MAGNETOMETER

(75) Inventors: Gavin W. Morley, London (GB); Ling Hao, Teddington (GB); John C. Mcfarlane, Teddington (GB)

(73) Assignee: Florida State University Research Foundation, Tallahassee, FL (US)

( * ) Notice: Subject to any disclaimer, the term of this patent is extended or adjusted under 35 U.S.C. 154(b) by 923 days.

(21) Appl. No.: 11/544,468

(22) Filed: Oct. 6, 2006

(65) Prior Publication Data
US 2007/0241747 A1 Oct. 18, 2007

Related U.S. Application Data

(60) Provisional application No. 60/724,443, filed on Oct. 7, 2005.

(51) Int. Cl.
*G01R 33/035* (2006.01)
*A61B 5/05* (2006.01)
(52) U.S. Cl. .................... 324/248; 505/846; 505/162; 600/409
(58) Field of Classification Search .............. 324/248; 505/162, 845–846; 257/31, 33–34, 36; 600/409; 327/527–528; 326/5
See application file for complete search history.

(56) References Cited

U.S. PATENT DOCUMENTS

| 4,678,945 | A  | * | 7/1987  | Sugano et al. .................. 326/5 |
| 5,456,986 | A  | * | 10/1995 | Majetich et al. ............. 428/403 |
| 5,665,980 | A  | * | 9/1997  | Onuma et al. .................. 257/35 |
| 6,320,369 | B1 | * | 11/2001 | Hidaka et al. ............. 324/117 R |
| 6,362,617 | B1 | * | 3/2002  | Hubbell ...................... 324/248 |
| 6,627,916 | B2 | * | 9/2003  | Amin et al. .................... 257/31 |
| 6,690,162 | B1 | * | 2/2004  | Schopohl et al. ............. 324/248 |
| 2003/0016010 | A1 | * | 1/2003 | Kandori et al. ............. 324/248 |
| 2004/0239319 | A1 | * | 12/2004 | Tralshawala et al. ........ 324/248 |
| 2005/0250651 | A1 | * | 11/2005 | Amin et al. .................. 505/846 |
| 2006/0104889 | A1 | * | 5/2006 | Harutyunyan et al. .... 423/447.3 |

OTHER PUBLICATIONS

Ketchen, M.B., et al., "Design, Fabrication, and Performance of Integrated Miniature Squid Susceptometers," IEEE Transactions on Magnetics, vol. 25, No. 2, Mar. 1989.
Wernsforfer, Wolfgang, "Classical and quantum magnetization reversal studied in nanometer-sized particles and clusters," to be published by John Wiley & Sons, New York, in *Advances in Chemical Physics*, Dec. 31, 2000.
Pakes, Chris I., "Development of Miniature DC SQUID Devices for the Detection of Single Atomic Spin-Flips," IEEE Transactions on Instrumentation and Measurement, vol. 50, No. 2, 310-313, Apr. 2001.
Jamet, M., et al., "Magnetic Anisotropy of a Single Cobalt Nanocluster," Physical Review Letters, vol. 86, No. 20, 4676-4679, May 14, 2001.

(Continued)

*Primary Examiner*—Bot L LeDynh
(74) *Attorney, Agent, or Firm*—Foley & Lardner LLP

(57) ABSTRACT

Multiple SQUID magnetometers that include at least two SQUID loops, each of which is composed of at least two Josephson Junctions connected in parallel with superconducting wires, are provided. The SQUID loops are fabricated such that they share a common Josephson Junction. Devices and application that employ the multiple SQUID magnetometers are also provided.

23 Claims, 5 Drawing Sheets

OTHER PUBLICATIONS

Bouchiat, V., et al., "Josephson junctions and superconducting quantum interference devices made by local oxidation of niobium ultrathin films," Applied Physics Letters, vol. 79, No. 1, 123-125, Jul. 2, 2001.

Faucher, M., "Niobium and niobium nitride SQUIDs based on anodized nanobridges made with an atomic force microscope," Physica C 368, 211-217, 2002.

Gallop, John, et al., "Miniature dc SQUID devices for the detection of single atomic spin-flips," Physica C 368, 109-113, 2002.

Lam, S.K.H., et al., "Development of a niobium nanosuperconducting quantum interference device for the detection of small spin populations," Applied Physics Letters, vol. 82, No. 7, 1078-1080, Feb. 17, 2003.

Chiorescu, I., "Coherent Quantum Dynamics of a Superconducting Flux Qubit," Science, vol. 299, 1869-1871, Mar. 21, 2003.

Drung, Dietmar, "High-$T_c$ and low-$T_c$ dc SQUID electronics," Superconductor Science and Technology, vol. 16, 1320-1336, Oct. 31, 2003.

Gallop, John, "SQUIDs: Some Limits to Measurement," Superconductor Science and Technology, vol. 16, 1575-1582, Nov. 13, 2003.

"Development of a Niobium Nano-SQUID for the Detection of Small Spin Populations," Abstract from International Superconducting Electronics Conference, Sydney, 2003, http://www.tip.csiro.au/ISEC2003/abstracts/PTu33.htm, printed Sep. 26, 2005.

Gardiner, C.H., et al., "Degenerate ground state and anomalous flux hysteresis in an $YBa_2Cu_3O_7$ grain boundary rf SQUID," Superconductor Science and Technology, vol. 17, S234-S240, Mar. 19, 2004.

Bick, M., "Axial high-temperature superconducting gradiometer with a flexible flux transformer," Applied Physics Letters, vol. 84, No. 26, Jun. 28, 2004.

Wellstood, F.C., et al., "Flicker ($1/f$) noise in the critical current of Josephson junctions at 0.09-4.2 K," Applied Physics Letters, vol. 85, No. 22, Nov. 29, 2004.

Drung, D., et al., "dc SQUID Readout Electronics With Up to 100 MHz Closed-Loop Bandwidth," IEEE Transactions on Applied Superconductivity, vol. 15, No. 2, 777-780, Jun. 2005.

"SQUIDS: A Technical Report—Part 1: Superconductivity," http://homepages.nildram.co.uk/~phekda/richdawe/squid/technical/part1.html, printed Sep. 26, 2005.

"SQUIDS: A Technical Report—Part 2; Flux Quantisation and Interference Effects," http://homepages.nildram.co.uk/~phekda/richdawe/squid/technical/part2.html, printed Sep. 26, 2005.

"SQUIDS: A Technical Report—Part 3: SQUIDs," http://homepages.nildram.co.uk/~phekda/richdawe/squid/technical/part3.html, printed Sep. 26, 2005.

"SQUIDS: A Technical Report—Part 4: Applications," http://homepages.nildram.co.uk/~phekda/richdawe/squid/technical/part4.html, printed Sep. 26, 2005.

* cited by examiner

MULTIPLE SQUID MAGNETOMETER

FIELD OF THE INVENTION

This invention relates generally to SQUID magnetometers that include multiple SQUID loops with a shared Josephson Junction and to methods and applications that make use of such magnetometers.

BACKGROUND OF THE INVENTION

Magnetometers are devices used to measure magnetic fields. Magnetometers based on superconducting quantum interference devices (SQUIDs) are among the most sensitive devices for measuring small magnetic fields. A conventional DC SQUID consists of two parallel Josephson Junctions disposed along a superconducting loop. These devices convert magnetic flux threading the superconducting loop into a quantity (e.g., current or voltage) that may be measured by an associated electronic stage.

Recently, advances in the field of nanotechnology have driven the search for SQUID magnetometers capable of detecting magnetic flux changes associated with nanoscale molecules and objects. See John Gallop, Superconductor Science and Technology, 16, 1575-1582 (2003) and Ling Hao et al., Superconductor Science and Technology, 16, 1479-1482 (2003). In one instance, a SQUID loop smaller than 1 μm has been used to measure the flipping of ~1000 electron spins. See M. Jamet, W. Wernsdorfer, C. Thirion, D. Mailly, V. Dupuis, P. Mélinon and A. Péres, Physical Review Letters, 86, 4676 (2001). Unfortunately, the sensitivity of SQUID magnetometers has been limited by the residual noise in these devices.

At low temperatures, the limiting noise is thought to be the circulating noise currents in the SQUID loop. These noise currents would prevent the noise energy in a SQUID from being smaller than $\hbar/2$, where $h=2\pi\hbar$ is Planck's constant, as discussed in John Gallop, Superconductor Science and Technology, 16, 1575-1582 (2003) and Ling Hao et al., Superconductor Science and Technology, 16, 1479-1482 (2003). This means that a change in magnetic field associated with an energy change of $0.5 \times 10^{-34}$ J is the minimum change that could be detected by a SQUID in a 1 Hz bandwidth. A bandwidth of 1 Hz corresponds approximately to a measurement time of 1 second. In practice that measurements longer than 1 second do not improve the sensitivity, as 1/f noise becomes larger.

In theory, an ideal SQUID magnetometer could be used to measure the change in magnetic field associated with a change in the nuclear spin of a single proton. In a strong magnetic field, the nuclear spin of a proton is in one of two states, separated by an energy difference of $$\Delta E = \gamma \hbar B,$$

where B is the applied magnetic field and the proton has a gyromagnetic ratio of $\gamma = 26.75 \times 10^7$ rad s$^{-1}$ T$^{-1}$. Increasing B increases the energy difference, $\Delta E$, but SQUIDs cannot function in magnetic fields that are too large. Niobium SQUIDs can be used at ~0.01 T, where the energy difference of a proton spin flip is $\Delta E \approx 2.7 \times 10^{-28}$ J. See, for example, Tsuyoshi Tajima, Proceedings of 8$^{th}$ European Particle Accelerator Conference, http://apt.lanl.gov/documents/pdf/LA-UR-02-3042.pdf; E. M. Forgan, S. J. Levett, P. G. Kealey, R. Cubitt, C. D. Dewhurst and D. Fort, Physical Review Letters, 88, 167003, 2002; and H. R. Kerchner, D. K. Christen and S. T. Sekula, Physical Review B, 21, 86 (1980). The highest coupling of a spin to the SQUID is achieved when the spin lies on the Josephson Junction. In this case, up to half of the magnetic flux is coupled, so the maximum energy detected by the SQUID as a result of the spin flip would fall to $1.3 \times 10^{-28}$ J. Under these ideal conditions, a SQUID could be used to measure a single nuclear spin flip, with a signal to noise ratio (SNR) of $>10^6$.

SQUIDs have been reported with a noise energy of 3 $\hbar$. See, for example, D. J. Van Harlingen, R. H. Koch and J. Clarke, App. Phys. Lett. 41, 197 (1982). However, a need exists for a SQUID magnetometer in which there is good coupling between the flux from a magnetic particle and the magnetometer. When this improved coupling is achieved, the need arises to increase the SQUID sensitivity further, for demanding applications such as single-molecule NMR.

SUMMARY OF THE INVENTION

The present invention provides SQUID magnetometers having increased sensitivity to changes in the magnetic fields associated with very small objects and, in particular, objects having dimensions smaller than the width of the semiconductor wires of their SQUID loops. Such objects include nanoscale objects, such as nanoparticles and biomolecules (e.g., proteins).

In their basic embodiment the SQUID magnetometers include at least two SQUID loops, each of which is composed of at least two Josephson Junctions connected in parallel with superconducting wires. The SQUID loops are fabricated to share a common Josephson Junction and superconducting wire. In this construction the circulating noise currents in each SQUID loop are different, but the loops can be synchronized such that the signal from an event along the common superconducting wire may be recorded at the same time by both loops. The correlated signal from the simultaneous measurements taken by both SQUID loops provides a measure of the magnetic field on this shared wire with a sensitivity that is much greater than the sensitivity provided by either SQUID loop operating independently. These devices may be used to study the magnetic properties of very small systems, particularly systems having dimensions smaller than the superconducting wires. In some embodiments, the multiple SQUID magnetometers may be used to measure the nuclear magnetic resonance (NMR) of a single molecule, such as a protein. The ability to measure the magnetic properties of a single molecule or particle is important because it avoids complications due to distributions of particles shapes, sizes and orientations that are present in larger samples.

A number of variations may be developed from this basic construction. For example, in some embodiments the SQUID magnetometers may include a plurality of SQUID loops (e.g., three or more) with each SQUID loop sharing a common Josephson Junction and superconducting wire. In these embodiments the sensitivity of the correlated signal may be improved by adding additional SQUID loops. In some embodiments the SQUID loops will include three Josephson Junctions. In such embodiments, independent current biasing of the SQUID loops may be accomplished by applying a separate bias current to each SQUID loop.

In another embodiment the present invention provides an array of SQUID loops. In this array, each SQUID loop shares a common Josephson Junction and superconducting wire with each of its neighbouring SQUID loops in the array. By coupling a sample that acts as a qubit to each common Josephson Junction in the array, the array of SQUID loops may be used as quantum computer. This can be understood as follows: A molecule, such as an endohedral fullerene (e.g., N@$C_{60}$—a nitrogen atom encapsulated in a $C_{60}$ Buckyball), on a common Josephson Junction between two SQUID loops should behave as an electron-spin qubit. The spin state of the qubit may be initialized and subsequently manipulated with a magnetic field applied across the SQUID loops. Qubit manipulation would be controlled by the application of electromagnetic pulses. Finally the change in magnetic flux associated with the change in spin state may be measured with the SQUID magnetometer. Interactions mediated by the normal electrons in the superconductor may provide coupling between the qubits along the array and make it possible to scale the system up to a quantum computer.

Further objects, features and advantages of the invention will be apparent from the following detailed description when taken in conjunction with the accompanying drawings.

DETAILED DESCRIPTION

The present invention is based, at least in part, on the inventors' realization that by sharing a common superconducting wire and Josephson Junction between two or more SQUID loops in a multiple SQUID magnetometer, a correlated signal having a much greater sensitivity than that of the individual SQUID loops may be measured.

Figure 1A:
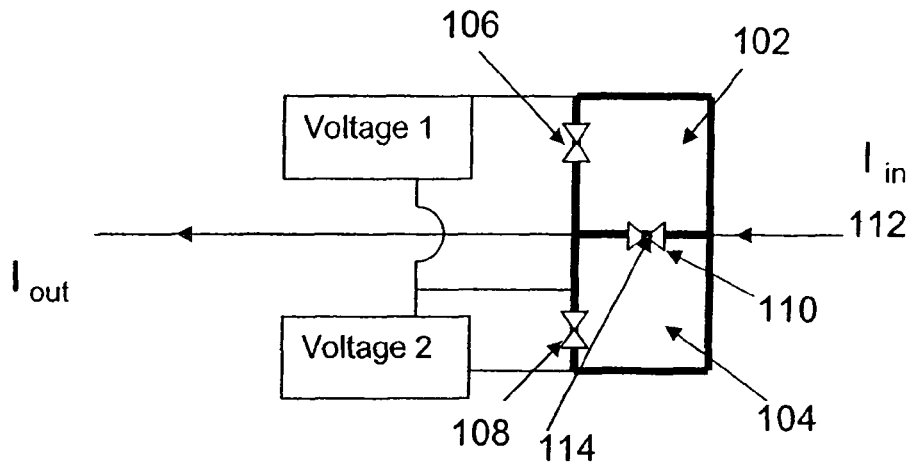
FIG. 1A is a circuit diagram showing the design of a double SQUID magnetometer. The noise is different for both SQUID loops, but the signal from a sample (represented by a small dark circle) on the common Josephson Junction is the same for both loops.

FIG. 1A is a schematic diagram showing the basic layout of a double loop SQUID magnetometer in accordance with the present invention. As shown in this figure, a typical double SQUID magnetometer includes a first SQUID loop 102 and a second SQUID loop 104 connected by superconducting wires. The double SQUID magnetometer includes three Josephson Junctions 106, 108, 110, one of which 110 is shared between the two SQUID loops 102, 104. In some respects, physically, this may look like a traditional gradiometer, which has been used in the past to cancel background magnetic fields and magnetic field noise. However, the polarizing magnetic field in a gradiometer would be applied in the plane of the SQUID loops to avoid destroying the superconductivity. In contrast, in the present invention, the polarizing field is preferentially oriented perpendicularly to the SQUID loops. Although for some applications this design may limit the maximum desirable applied magnetic field (e.g., to around 0.1-1 T, in some embodiments), it provides far superior coupling of the sample flux to the SQUID loops.

If it is desired to have a higher polarization, a high polarizing field could be initially applied perpendicular to the SQUID loops. This field could then be reduced to around 0.1-1 T for a SQUID measurement, with each SQUID loop simultaneously producing one measurement. Magnetic fields can be reduced from 35 T to 0.1 T in a time of seconds to minutes, which is a short time compared to the ($T_1$ spin-lattice) relaxation times of many nuclear spins and certain electron spins at these low temperatures. The signals from the different SQUIDs would be combined to give the highest sensitivity measurement of the sample.

The device could otherwise be operated in the same ways that a conventional SQUID is operated. For example, in the double SQUID embodiment depicted in FIG. 1, a single bias current 112 may be applied to the SQUID loops and the voltage across each of the two SQUID loops may be measured. The signal measurements from each SQUID loop should be synchronized so that they record the same events at the same time. In this construction, the noise currents in the two SQUID loops are different, but the signal due to a sample 114 on the shared Josephson Junction 110 is measured at the same time by both SQUID loops. The correlated signal therefore produces a more sensitive measurement than either SQUID loop alone. This design can reduce the effects of noise currents such that the noise energy of the measurement is below the quantum limit of $\hbar/2$ applicable to a single-loop SQUID.

Figure 1B:
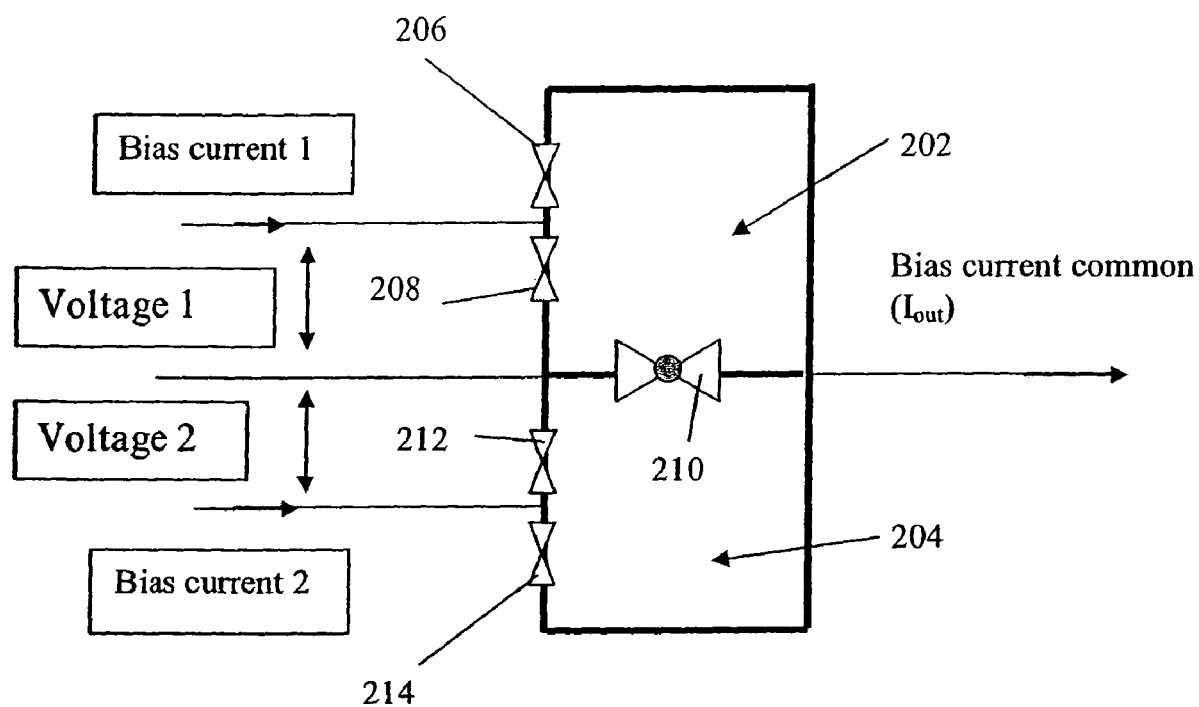
FIG. 1B is a circuit diagram showing the design of a double SQUID magnetometer with independent current biasing of each SQUID loop.

A slightly modified embodiment of a double SQUID magnetometer is shown in FIG. 1B. In this embodiment each of the two SQUID loops 202, 204 includes three Josephson Junctions 206, 208, 210, 212, 214, one of which 210 is a shared between the SQUID loops. In this design, a separate bias current 216, 218 may be applied to each SQUID loop to provide for independent tuning.

After an initial SQUID measurement (e.g., lasting on the order of one second) by the multiple SQUID magnetometer, electromagnetic pulses could be applied to perform some operation (e.g., a spin flip) to the spin(s) of a sample. Such an operation would typically be performed in NMR and quantum computing applications. The multiple SQUID magnetometer would then be used again to take a second measurement (e.g., lasting on the order of one second) of the state of the spin(s). Comparing the initial and subsequent measurements made by the multiple SQUID magnetometer would reveal the effects of the operation performed on the spin(s).

Figure 2:
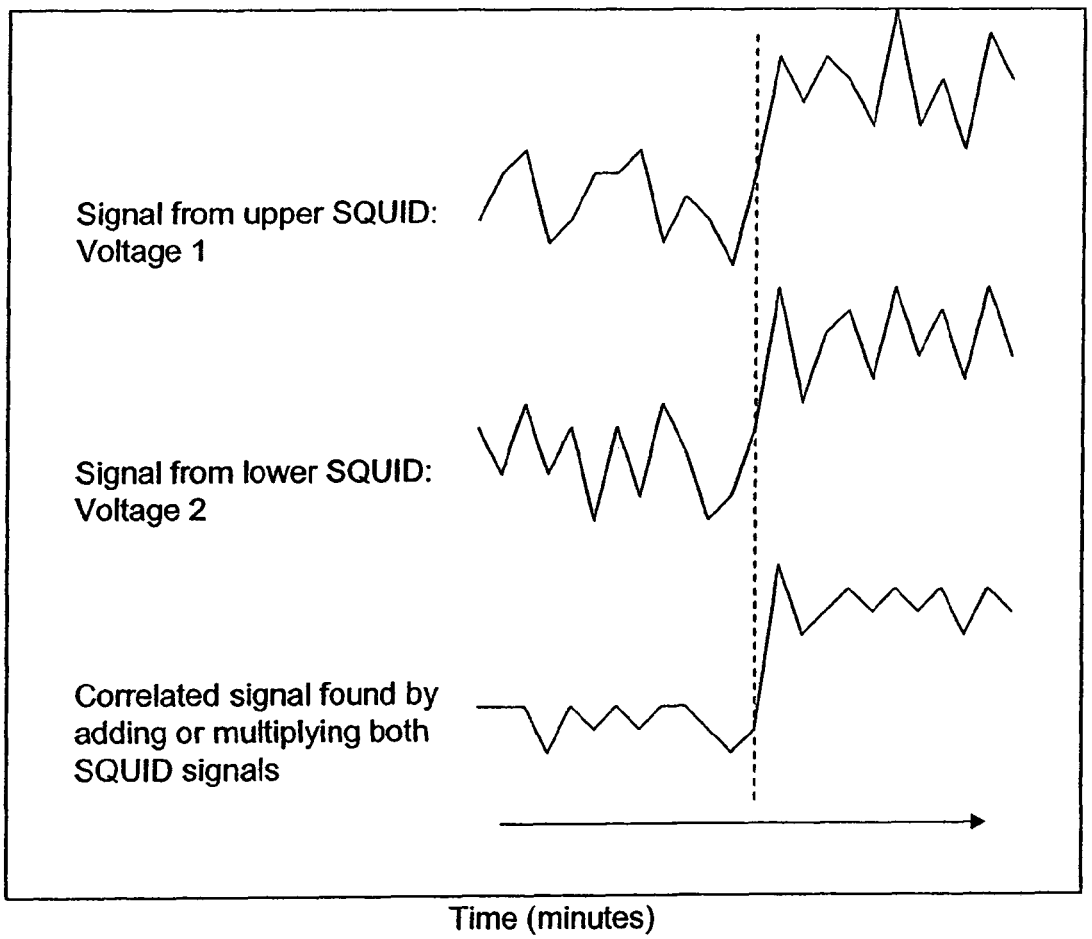
FIG. 2 is a schematic diagram showing the voltage measured by an event (e.g., a spin flip) generated by a sample coupled to the common Josephson Junction of the double SQUID magnetometer shown in FIG. 1. The upper signal represents the voltage measured across the first SQUID loop. The middle signal represents the voltage measured across the second SQUID loop. The lower signal represents the correlated signal, which may be found by adding or multiplying the voltage signals from the first and second SQUID loops.

FIG. 2 is a schematic diagram showing the types of signals that could be measured by the double SQUID magnetometer of FIG. 1 operating in current bias mode. This figure represents signals generated by a double SQUID magnetometer in a nuclear magnetic resonance application wherein a radio frequency (RF) pulse of the correct frequency is used to flip the spin in a sample (e.g., a protein) coupled to the common Josephson Junction. In this case, the spin could be measured initially with the multiple loop SQUID magnetometer for 1 second. Then an RF $\pi$-pulse could be applied, which could last on the order of 100 µs, depending on the power used. Finally, another SQUID measurement could be made that would be compared to the initial measurement. The nuclear spin could be polarized initially in a very high magnetic field, as long as this was reduced to ~0.01 T for the SQUID measurements.

The SQUID loops and their Josephson Junctions may be made from superconducting materials using known lithographic production techniques. Electronics and circuitry, including control, amplification and noise reduction electronics and circuitry, used to obtain magnetic flux measurements with conventional SQUID magnetometers may be used to run the present SQUID magnetometers. The multiple SQUID magnetometers are preferably operated at cryogenic temperatures (e.g., desirably 20 K, or lower) and magnetically shielded in order to maximize their signal to noise ratio.

A general discussion of suitable materials, Josephson Junction types, production techniques, electronics and circuitry, and cooling and magnetic shielding equipment for use in the present multiple SQUID magnetometers may be found in the following references: "SQUIDS, the Josephson Effects and Superconducting Electronics" by John Gallop (pub Adam Hilger), March 1991; "The SQUID Handbook Vol. 1", eds. John Clarke and Alex I. Braginski, published by Wiley-VCH Verlag GmbH & Co. KGaA, Weinheim (2004); John Gallop, Superconductor Science and Technology, 16, 1575-1582 (2003); Ling Hao et al., Superconductor Science and Technology, 16, 1479-1482 (2003); M. Jamet, W. Wemsdorfer, C. Thirion, D. Mailly, V. Dupuis, P. Mélinon and A. Péres, Physical Review Letters, 86, 4676 (2001); Tsuyoshi Tajima, Proceedings of $8^{th}$ European Particle Accelerator Conference, http://apt.lanl.gov/documents/pdFLA-UR-02-3042.pdf; E. M. Forgan, S. J. Levett, P. G. Kealey, R. Cubitt, C. D. Dewhurst and D. Fort, Physical Review Letters, 88, 167003, 2002; H. R. Kerchner, D. K. Christen; S. T. Sekula, Physical Review B, 21, 86 (1980); M. P. Augustine, D. M. TonThat, J. Clarke, Solid State Nuclear Magnetic Resonance, 11, (no. 1-2), 139-56 (1998); J. Gallop, P. W. Josephs-Franks, Julia Davies, Ling Hao and John Macfarlane, Physica C, 368, 109-113 (2002); S. K. H. Lam and D. L. Tilbrook, Applied Physics Letters, 82, 1078, (2003); F. C. Wellstood, C. Urbina and J. Clarke, Applied Physics Letters, 85, 5296 (2004); M. B. Ketchen, D. D. Awschalom, W. J. Gallagher, A. W. Kleinsasser, R. L. Sandstrom, J. R. Rozen; B. Bumble, IEEE Transactions on Magnetics, 25, 1212 (1989); Pakes et al., IEEE Transactions on Instrumentation and Measurement, 50, 310 (2001); Faucher et al., Physica C, 368, 211 (2002); Drung et al., IEEE Transactions on Applied Superconductivity, 15, 777 (2005); Drung, Superconductor Science and Technology, 16, 1320 (2003); Bick et al., Applied Physics Letters, 84, 5347 (2004); Bouchiat et al., Applied Physics Letters, 79, 123 (2001); and Gardiner et al., Superconductor Science and Technology, 17, S234 (2004).

Figure 3A:
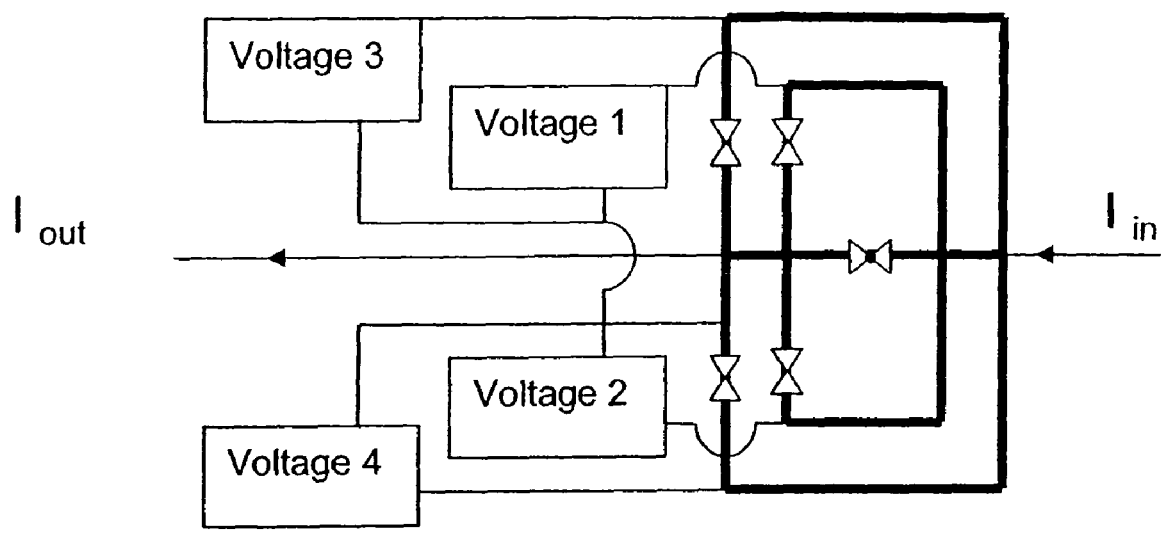
FIG. 3A. is a circuit diagram showing the design of a four loop SQUID magnetometer.
Figure 4A:
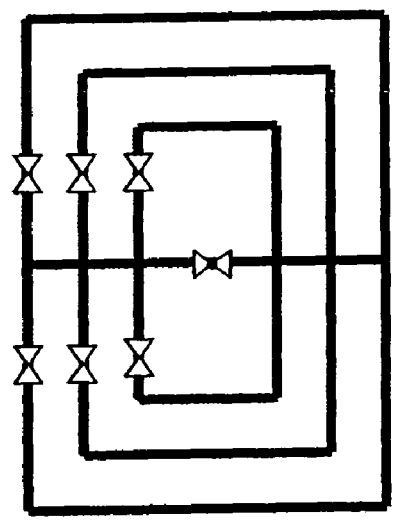
FIG. 4A is a circuit diagram showing the design of a six loop SQUID magnetometer. (The non-superconducting wires and other circuitry are not shown for clarity.)
Figure 3B:
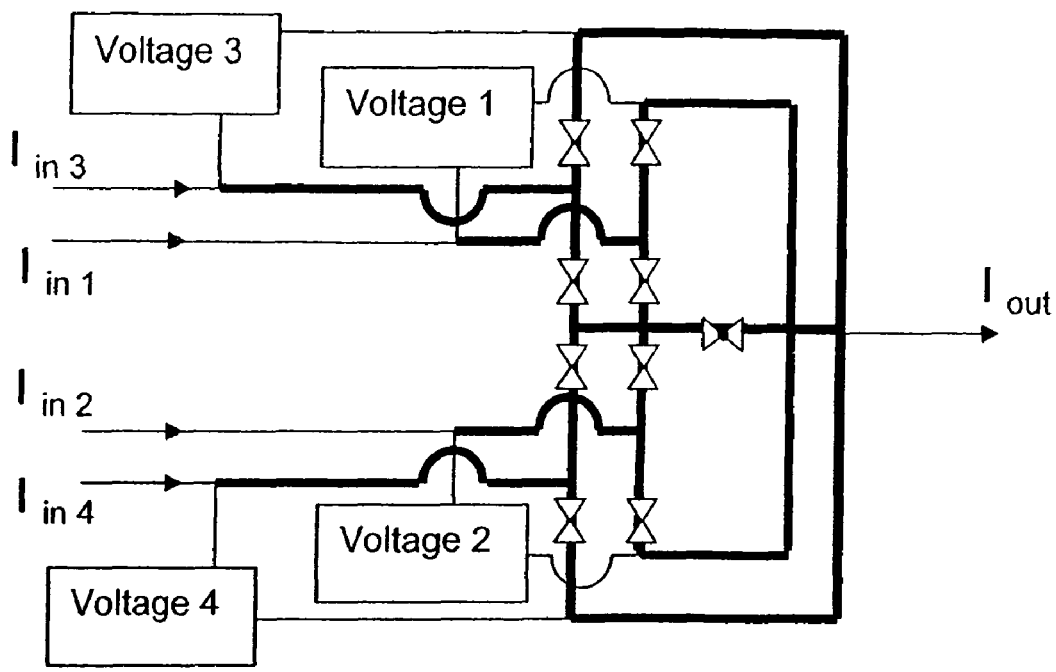
FIG. 3B is a circuit diagram showing the design of a four loop SQUID magnetometer with independent current biasing of each SQUID loop.
Figure 4B:
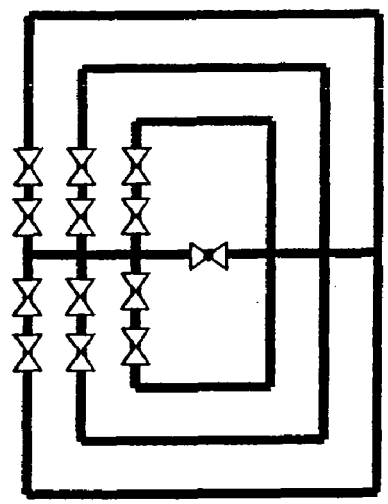
FIG. 4B is a circuit diagram showing the design of a six SQUID magnetometer adapted for independent current biasing of each SQUID loop. (The non-superconducting wires and other circuitry are not shown for clarity.)

Further improvements in sensitivity may be achieved by adding more SQUID loops to the magnetometer, as shown in FIGS. 3A and 4A. As shown in these figures, each SQUID loop shares a common superconducting wire (represented by a thick black line), including a common Josephson Junction (represented by an hourglass shape). Thus, each of the extra SQUID loops is coupled to half of the magnetic flux generated from a sample (represented by a small black dot) directly coupled to the common Josephson Junction. Like the double SQUID magnetometer of FIG. 1B, the multiple SQUID magnetometers of FIGS. 3A and 4A could be modified to allow for independent biasing of the SQUID loops, as shown in FIGS. 3B and 4B.

The multiple SQUID magnetometers may be operated in a current bias mode or a voltage bias mode. However, operating in flux-locked loop mode (achieved with a current bias controlled by signal feedback) is generally preferred as it combines high sensitivity and a wide measurement range. For example, using a current bias mode, a DC bias current is passed through the SQUID loops. The current is kept constant (e.g., using an appropriate feedback system) and the voltage across each SQUID loop, which depends on the magnetic flux threading the SQUID loops, is measured. A single bias current may be used for all of the SQUID loops, or separate bias currents may be applied to the SQUID loops to allow for independent tuning. A correlated voltage signal for the magnetometer is then calculated from the voltage signals measured across each SQUID loop. Alternatively, using a voltage bias mode, a bias voltage is applied across the magnetometer. Here, the voltage is kept constant, the current across each SQUID loop is measured and a correlated current signal is calculated.

Standard mathematical techniques could be used to obtain the correlated signal from the two (or more) measured signals. For example, the two (or more) measured signals could be added so that the correlated signal at any time is equal to the sum of the two (or more) measured signals at that time. Alternatively, the two (or more) measured signals could be multiplied so that the correlated signal at any time is equal to the product of the two (or more) measured signals at that time.

The dimensions of the SQUID loops are desirably minimized to improve their signal to noise ratio (SNR) because larger SQUID loops have a bigger inductance, picking up more magnetic field noise. Typically, the SQUID loops are "nano-SQUIDs" having SQUID loop diameters of no more than about 1000 nanometers (nm). This arrangement includes embodiments where the SQUID loops have diameters of no more than about 500 nm, no more than about 200 nm and no more than about 100 nm. In addition, all of the SQUID loops in the multiple SQUID design share the current noise present in the common superconducting wire. This shared noise is not reduced by measuring the correlated signal from multiple SQUID loops, so the length of the shared superconducting wire is preferably minimized. It is desirable, but not necessary for each SQUID loop in the multiple loop SQUID to be identical or at least as nearly identical as possible given the realities of SQUID construction (i.e., substantially identical). However, because it is difficult in practice to make SQUID loops that are sufficiently identical, it may be desirable to design the multiple SQUID devices to allow for independent current biasing, as shown in FIGS. 1B, 3B and 4B, such that the SQUID loops may be operated at its most sensitive point of the V-I curve.

Figure 5:
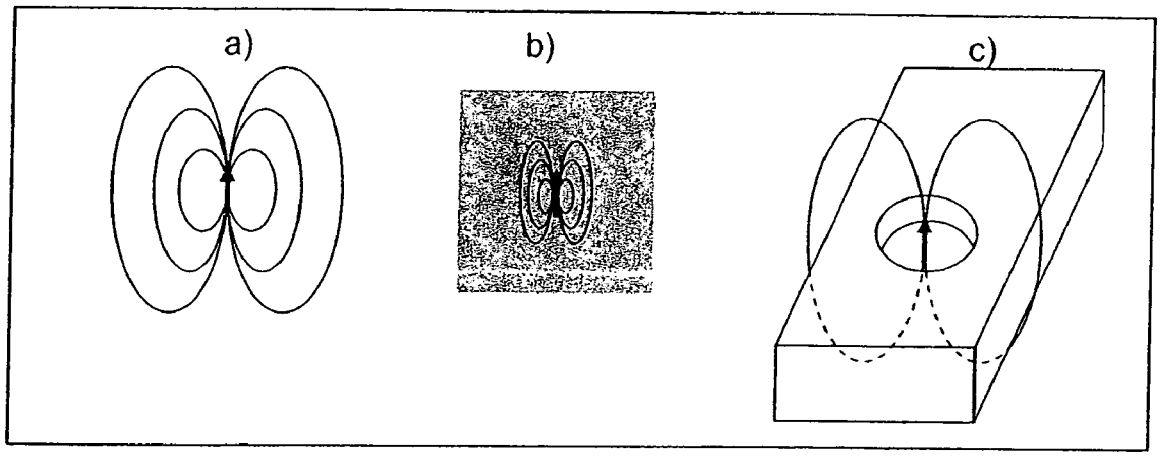
FIG. 5. a) Flux lines of a magnetic dipole in free space. b) Flux can be trapped if the dipole is inside a bulk superconductor. c) A small hole in the superconductor may allow the flux to escape. The dipole is shown schematically in the centre of the hole, but it could be on the inner surface of the hole.

In order to maximize the sensitivity of the multiple loop SQUID magnetometers, it is desirable for the samples to be strongly coupled to the SQUID loops. This result may be accomplished by coupling the sample 114 directly to the common Josephson Junction of the SQUID loops. In order to further maximize the sensitivity of the multiple SQUID magnetometers the SQUID loops may be designed to minimize the Meissner effect which may decrease the coupling between the magnetic flux produced by a sample and the SQUID loops. The Meissner effect may prevent the sample's magnetic flux from following the path it would take in free space (FIG. 5a). (See, for example, M. Tinkham, *Introduction to Superconductivity*, Dover $2^{nd}$ edition (2004)). Encased in bulk superconductor, the flux may be trapped (FIG. 5b). Several designs may be adopted to offset this effect. For example, in some embodiments of the multiple SQUID magnetometers the width of the superconducting wires is no more that about the penetration depth of the magnetic flux into the superconductor (e.g., about 100 nm or less). In some embodiments of the multiple SQUID magnetometers, the superconducting wires may be made from a type II superconductor, such as niobium, wherein there is a range of magnetic fields for which vortex lines of flux can penetrate the bulk superconductor. These vortices are small cylinders of normal metal, carrying a quantized amount of flux. It is possible that additional flux originating at a nuclear spin could escape along this path. Alternatively, small holes could be drilled into the superconducting wire to provide a path for the flux (FIG. 5c). A focused ion beam may be used to drill a hole of the appropriate size. This technique is well-suited for Josephson Junctions made with an insulating layer.

Multiple loop SQUID magnetometers of the types shown in FIGS. 1, 3 and 4 may be used to measure very small magnetic fields (and very small changes in the magnetic fields) generated by samples with small spin populations, including single molecules and magnetic nanoparticles. For example, in some instances the multiple loop SQUID magnetometers may be used to detect less than 1000 electron spins. This includes magnetometers capable of detecting fewer than 10 electron spins and further includes magnetometers capable of detecting a single electronic spin flip. In some embodiments the multiple SQUID magnetometers can measure a single nuclear spin flip with a SNR of at least $10^6$.

The multiple loop SQUID magnetometers may be used in a variety of applications including, but not limited to, metrology and molecular structure determination. For example, by putting a single molecule of a sample, such as a protein, on the common Josephson Junction of a multiple SQUID magnetometer, single-molecule NMR studies may be conducted. This could borrow many techniques from traditional ensemble NMR, without taking an average over the possible orientations of the molecule, and without having to grow a crystal. Chemical shifts contain information about the structure and dynamics of the molecule, and multi-dimensional pulsed experiments can provide much more information. In these applications, the sample is desirably selected or prepared such that magnetic flux measurements carried out at low temperatures on a multiple SQUID magnetometer would not change the structure of the sample substantially.

Another application for which multiple loop SQUID magnetometers are well-suited is in quantum computing. A quantum computer (QC) can solve certain problems that are intractable on a classical computer. A QC manipulates quantum information that can be represented as quantum bits, or qubits. Qubits are two-level quantum systems. After a quantum computation, the value of the qubit must be measured. Thus, in quantum computing, the qubits must retain their quantum information long enough to allow for their measurement after a calculation has been performed. An electron spin is an example of a two-level quantum system that may be used as a qubit in a quantum computer. A general discussion of quantum computing may be found in Nielsen et al., *Quantum Computation and Quantum Information*, Cambridge University Press (2000).

Figure 6:
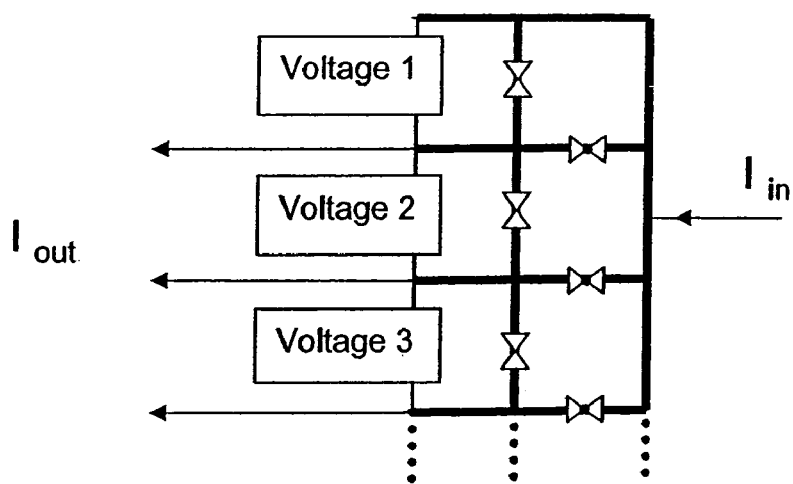
FIG. 6 is a circuit diagram showing the design of a linear array of SQUID loops that could be used in a quantum computer.

The multiple loop SQUID magnetometers used in quantum computing applications may have a slightly different design than those shown in FIGS. 1, 3 and 4. A schematic diagram of a multiple loop SQUID magnetometer that could be used in quantum computing applications is shown in FIG. 6. As shown in this figure, the multiple loop SQUID magnetometer is composed of an array of SQUID loops, wherein each SQUID loop in the array shares a common superconducting wire (represented by a thick black line), including a Josephson Junction (represented by an hourglass shape), with each of its neighbouring SQUID loops in the array. By putting a molecule or particle (represented by a small dark dot) capable of acting as a qubit on the common superconducting wire the multiple SQUID design could be used to measure the value of each electron spin qubit. Although three SQUID loops in a linear array are shown in FIG. 6, the design could be scaled up to any number of SQUID loops in one, two and three dimensional arrays.

In a exemplary embodiment, the operation of such a quantum computer includes at least three steps performed to the qubits: initialization, manipulation and readout. Qubits must first be initialized to a useful starting state. A description of quantum computing using SQUID is provided in Chiorescu et al., Science, 299, 1869 (2003). Briefly, quantum computation could be carried out by the present multiple SQUID magnetometers by applying a high polarizing magnetic field to the qubit under low temperature conditions. Fields of around 4 T or above would generally be sufficient for electron spins at 4 K or below, while fields of 35 T would be preferable for nuclear spins at significantly lower temperatures (e.g., 0.1 K). Alternatively, the nuclear spins of the qubits could be polarized by transferring polarization from the electrons with techniques such as DNP (dynamic nuclear polarization). These techniques are described in G. W. Morley, D. Phil. Thesis, University of Oxford, 2005

After a polarization technique has been used to line up the qubit spins with the applied field, the qubits may be manipulated. This stage may involve a number of resonant pulses chosen to perform a particular QC algorithm. This step has been successfully demonstrated for NMR QC with an unpolarized sample. See, for example, L. M. K. Vandersypen, M. Steffen, G. Breyta, C. S. Yannoni, M. H. Sherwood and I. L. Chuang, Nature 414, 83 (2001).

The final step in the operation of a QC is to readout the state of the qubits. This read-out operation could be done with the multiple SQUID magnetometers, as described in detail above.

The molecule or particle coupled to each common superconducting wire may be any such molecule or particle capable of acting as a multiple-level quantum system which can be measured using the multiple SQUID magnetometer. An example of a suitable molecule is N@C$_{60}$. N@C$_{60}$ is an attractive molecule for use as a qubit because it has an electron spin with a long decoherence time, $T_2$. This $T_2$ time characterizes how long quantum information can be stored in N@C$_{60}$, and has been measured as 215 μs at a temperature of 3.7 K. See G. W. Morley, D. Phil. Thesis, University of Oxford, 2005 and W. Harneit, Physical Review A, 65, 032322 (2002). Prior to the present invention, there was no technique available to measure the electron spin of a single molecule of N@C$_{60}$. The timescale on which this could be done is set by the electronic $T_1$ time, which characterizes how long classical information is stored by the electronic spin. This $T_1$ time has been measured as 4.5 minutes at 3.7 K, (G. W. Morley, D. Phil. Thesis, University of Oxford, 2005), so the chance of a spin flip during a 1 second measurement would be less than 0.5%. Initialization and manipulation of the quantum information in N@C$_{60}$ has been described previously. See G. W. Morley, D. Phil. Thesis, University of Oxford, 2005. The positioning of molecules of N@C$_{60}$ onto SQUID loops could be accomplished by using an STM tip to pick up and drop off one molecule at a time as suggested in J. Gallop, P. W. Josephs-Franks, Julia Davies, Ling Hao and John Macfarlane, Physica C, 368, 109-113 (2002). Alternatively, pits could be made in the superconducting wires with a focused ion beam (FIB). This may enable molecules of N@$C_{60}$ to be applied in solution, as some solution would remain in the pit after the rest washed away.

It is necessary for the qubits along the array of SQUID loops to interact in order for quantum computations to be carried out. To this end, it would be preferable to provide an array of SQUID loops having dimensions small enough to allow direct dipolar and/or exchange interactions between the qubits. However, it is difficult to achieve separations of less than ~100 nm with the technology currently available to fabricate SQUID loops. As a result the direct dipolar and exchange interactions between qubits may be insufficient and the qubits may have to rely on other interactions, such as indirect exchange interactions.

The Cooper-pair electrons in the superconductor have no net spin, so they will not couple to the qubit spins. Instead, indirect exchange interactions in this system could be mediated by the normal electrons in the superconductor. These normal electrons are present at any temperature above absolute zero, and tuning the temperature controls their number in a predictable way. The strength of this indirect exchange would depend on the coherence length of the normal electrons. This can be on the order of micrometers in very pure niobium crystals. Defects in the crystal scatter the normal electrons, so these should be reduced by annealing the SQUID array at high temperatures, after fabrication.

The quantum state of a SQUID has been used as a qubit also. (I. Chiorescu, P. Bertet, K. Semba, Y. Nakamura, C. J. P. M. Harmans, J. E. Mooij, Nature 431, 159 (2004) In the magnetometers of the present invention, this state would be coupled to the qubit (e.g., N@$C_{60}$) spin, so the quantum information stored in the combined system could make an even more useful quantum computer.

For the purposes of this disclosure and unless otherwise specified, "a" or "an" means "one or more". All patents, applications, references and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

The invention has been described with reference to various specific and illustrative embodiments. However, it should be understood that many variations and modifications may be made while remaining within the spirit and scope of the invention.

What is claimed is:

1. A multiple SQUID magnetometer comprising:
 (a) a first SQUID loop comprising at least two Josephson Junctions connected in parallel by superconducting wires; and
 (b) a second SQUID loop comprising at least two Josephson Junctions connected in parallel by superconducting wires;
 wherein the first and second SQUID loops share a common Josephson Junction, and further comprising a sample coupled to the common Josephson Junction, wherein the sample is disposed in a pit in the common Josephson Junction.

2. The magnetometer of claim 1 wherein the first and second SQUID loops have diameters of no more than about 200 nm.

3. The magnetometer of claim 1 wherein the sample has dimensions smaller than the width of the superconducting wires.

4. The magnetometer of claim 3 wherein the width of the superconducting wires is no greater than about 100 nm.

5. The magnetometer of claim 1 wherein the sample comprises a magnetic nanoparticle.

6. The magnetometer of claim 5 wherein the magnetic nanoparticle comprises an endohedral fullerene.

7. The magnetometer of claim 6 wherein the endohedral fullerene is a N@$C_{60}$ molecule.

8. The magnetometer of claim 1 wherein the sample is a biomolecule.

9. The magnetometer of claim 8 wherein the biomolecule is a protein.

10. A multiple SQUID magnetometer comprising:
 (a) a first SQUID loop comprising at least two Josephson Junctions connected in parallel by superconducting wires; and
 (b) a second SQUID loop comprising at least two Josephson Junctions connected in parallel by superconducting wires;
 wherein the first and second SQUID loops share a common Josephson Junction, and further comprising a third SQUID loop comprising two Josephson Junctions connected in parallel by superconducting wires, wherein the first, second and third SQUID loops share a common Josephson Junction, and wherein each Josephson Junction is configured to be separately biased.

11. The magnetometer of claim 10 further comprising a plurality of SQUID loops, the plurality of SQUID loops including at least four SQUID loops, wherein each of the SQUID loops in the plurality of SQUID loops comprises two Josephson Junctions connected in parallel by superconducting wires, and further wherein each of the SQUID loops in the plurality of SQUID loops share a common Josephson Junction.

12. The magnetometer of claim 10 wherein the first, second and third SQUID loops each comprise at least three Josephson Junctions.

13. A nuclear magnetic resonance apparatus comprising the magnetometer of claim 1 incorporated into a nuclear magnetic resonance instrument.

14. A multiple SQUID array comprising an array of SQUID loops, each SQUID loop comprising at least two Josephson Junctions connected in parallel by superconducting wires, wherein each SQUID loop in the array shares a common Josephson Junction with each of its neighboring SQUID loops, and further comprising a sample coupled to each common Josephson Junction.

15. The array of claim 14 wherein the array is a one dimensional array.

16. The array of claim 14 wherein the array is a two dimensional array.

17. The array of claim 14 wherein the array is a three dimensional array.

18. The array of claim 14 wherein the samples are capable of acting as qubits.

19. The array of claim 18 wherein the samples comprise endohedral fullerenes.

20. The array of claim 19 wherein the endohedral fullerenes comprise N@C$_{60}$ molecules.

21. A SQUID-based quantum computer comprising the array of claim 18 and a magnetic field source adapted to apply a magnetic field perpendicular to the SQUID loops.

22. The magnetometer of claim 1 further comprising a magnetic field source adapted to apply a magnetic field perpendicular to the first and second SQUID loops.

23. The magnetometer of claim 1 wherein the sample is mechanically coupled to the common Josephson Junction.

* * * * *